(12) United States Patent
Ichitsubo et al.

(10) Patent No.: US 6,633,005 B2
(45) Date of Patent: Oct. 14, 2003

(54) MULTILAYER RF AMPLIFIER MODULE

(75) Inventors: Ikuroh Ichitsubo, Kanagawa Prefecture (JP); Guan-Wu Wang, Palo Alto, CA (US)

(73) Assignee: Micro Mobio Corporation, Palo Alto, CA (US)

( * ) Notice: Subject to any disclaimer, the term of this patent is extended or adjusted under 35 U.S.C. 154(b) by 0 days.

(21) Appl. No.: 10/041,863

(22) Filed: Oct. 22, 2001

(65) Prior Publication Data

US 2003/0076659 A1 Apr. 24, 2003

(51) Int. Cl.[7] .................................................. H05K 1/16
(52) U.S. Cl. .................... 174/260; 174/255; 174/261; 174/262; 361/753; 361/760; 361/761; 361/799; 29/832; 29/846; 257/784; 257/707
(58) Field of Search ................... 174/260, 261, 174/262, 266, 252; 361/760, 707, 711, 718, 753, 761, 764, 783, 792, 795, 799; 257/706, 707, 712, 784, 783; 29/830, 832, 846, 850, 852

(56) References Cited

U.S. PATENT DOCUMENTS

| | | | | |
|---|---|---|---|---|
| 5,687,474 A | * | 11/1997 | Hamzehdoost et al. | ........ 29/832 |
| 5,717,249 A | * | 2/1998 | Yoshikawa et al. | .......... 257/728 |
| 5,728,248 A | * | 3/1998 | Weber | .......................... 156/257 |
| 5,731,227 A | | 3/1998 | Thomas | |
| 5,796,165 A | * | 8/1998 | Yoshikawa et al. | .......... 257/728 |
| 5,847,935 A | * | 12/1998 | Thaler et al. | ................ 361/761 |
| 5,874,321 A | | 2/1999 | Templeton, Jr. et al. | |
| 5,933,709 A | | 8/1999 | Chun | |
| 5,943,558 A | | 8/1999 | Kim et al. | |
| 6,048,754 A | | 4/2000 | Katayama et al. | |
| 6,097,612 A | * | 8/2000 | Ishikawa et al. | ............. 361/794 |
| 6,146,918 A | | 11/2000 | Lee | |
| 6,147,401 A | | 11/2000 | Solberg | |
| 6,153,449 A | | 11/2000 | Yglesia et al. | |
| 6,190,939 B1 | | 2/2001 | Burns | |
| 6,197,613 B1 | | 3/2001 | Kung et al. | |
| 6,259,335 B1 | * | 7/2001 | Ingram et al. | ............... 333/128 |
| 6,333,856 B1 | * | 12/2001 | Harju | .......................... 361/761 |
| 6,373,131 B1 | * | 4/2002 | Karnezos | .................... 257/712 |
| 6,449,168 B1 | * | 9/2002 | Soderholm | ................... 361/761 |
| 6,455,925 B1 | * | 9/2002 | Laureanti | .................... 257/678 |

OTHER PUBLICATIONS

US 2001/0004115A1, patent application Publication, publication date Jun. 2001.*
RF Micro Devices, Inc., "RF2196, 3V PCS Linear Power Amplifier," Product Description, over one year old, pp. 203–209.
Figures 1 & 2 are representative of two conventional designs A & B based on examination of corresponding products in production more than one year.

* cited by examiner

*Primary Examiner*—David L. Talbott
*Assistant Examiner*—J B Patel
(74) *Attorney, Agent, or Firm*—Francis L. Conte (57) ABSTRACT

An RF amplifier module includes PC boards laminated atop a bottom conductor plate. The boards include an RF semiconductor amplifier chip mounted in a well extending to the bottom plate disposed in electrical connection with the chip.

28 Claims, 4 Drawing Sheets

MULTILAYER RF AMPLIFIER MODULE

BACKGROUND OF THE INVENTION

The present invention relates generally to electrical signal power amplifiers, and, more specifically, to radio frequency (RF) power amplifiers.

Radio frequency transmission of an electrical signal requires corresponding power amplification thereof for the intended transmission range. RF signals typically have a broad frequency spectrum from several megahertz (MHZ) to tens of gigahertz (GHZ), and higher.

RF transmission typically occurs at a single band for specific applications such as cellular phone transmissions. Typical cellular phone transmission bands include 800 MHZ and 1900 MHZ in the United States, and 900 MHZ and 1800 MHZ in most countries in Europe and Asia.

Portable cellular phones are being developed in ever decreasing size for convenience of use. Correspondingly, the electrical components thereof must also decrease in size while still providing effective transmission performance. However, the substantially high transmission frequencies associated with RF communication increases the difficulty of miniaturization of the transmission components.

A major component of the cellular phone is the RF power amplifier thereof. Signal amplification requires corresponding power that generates heat in the amplifier which must be suitably dissipated for protecting the amplifier and associated electronic components.

The RF amplifier is conventionally in the form of a semiconductor integrated circuit (IC) chip or die in which power amplification is effected with substantial linearity. The amplifier chip must then be interconnected in a circuit with certain off-chip components such as inductors, capacitors, resistors, and transmission lines used for controlling operation of the amplifier chip and providing impedance matching of the input and output RF signals.

The amplifier chip and associated components are typically assembled on a printed circuit (PC) board in which the components are interconnected by printed metal circuits patterned atop a dielectric substrate. In a typical PC board, the chip and associated components are all mounted on one side of the board with the opposite, substrate-side of the board being exposed.

This single board configuration requires corresponding area over which the chip and components may be distributed. The board is typically rectangular and has a practical minimum size or surface area corresponding with the minimum sizes of the amplifier chip and required components.

Since the amplifier chip is mounted atop the PC board, the dielectric substrate thereof provides a thermally insulating barrier below the bottom of the chip, which chip requires suitable heat dissipation primarily from the top thereof. Since the PC amplifier board is mounted in a corresponding housing of the cellular phone in proximity to other electronic circuits therein, suitable accommodations must be provided for dissipating the heat and protecting the various electronic components thereof.

And, since RF circuits operate at high signal frequencies, electromagnetic radiation is created which can interfere with other components of the cellular phone, or with other electronic devices within the transmission range of the phone. Accordingly, a cellular phone require suitable shielding against electromagnetic interference (EMI) which affects the practical size of the phone.

RF signals are also subject to parasitic capacitance in the amplifier circuits which affects performance thereof. The relatively small distances between the RF amplifier and its associated components may experience not only parasitic capacitance but also differences in electrical potential between the components and ground which can also affect performance.

For example, the amplifier chip itself has an electrical ground which is correspondingly connected to an electrical ground of the printed circuit. The length or distance of the conducting path between the amplifier chip and ground, and between the PC components and ground may vary and correspondingly affect performance of the RF signal.

Yet another significant consideration in the miniaturization of RF amplifier circuits is the required impedance matching for the input and output RF signals of the amplifier. Input and output impedance matching circuits are conventional and typically include capacitors, resistors, and inductors in associated transmission lines for the RF signals into and out of the amplifier chip. However, these impedance matching circuits are specifically tailored in off-chip components and located remotely from the amplifier chip.

Accordingly, the amplifier chip itself must include many electrical input and output terminals or bonding pads to which the corresponding portions of the impedance matching circuits are separately joined. This increases the difficulty of assembly and required size of the associated amplifier components, and affects the overall marketability of the cellular phone.

It is therefore desired to provide a compact RF amplifier module having improved heat dissipation and integration of components.

BRIEF SUMMARY OF THE INVENTION

An RF amplifier module includes PC boards laminated atop a bottom conductor plate. The boards include an RF semi-conductor amplifier chip mounted in a well extending to the bottom plate disposed in electrical connection with the chip.

BRIEF DESCRIPTION OF THE DRAWINGS

The invention, in accordance with preferred and exemplary embodiments, together with further objects and advantages thereof, is more particularly described in the following detailed description taken in conjunction with the accompanying drawings in which.

DETAILED DESCRIPTION OF THE INVENTION

Figure 1:
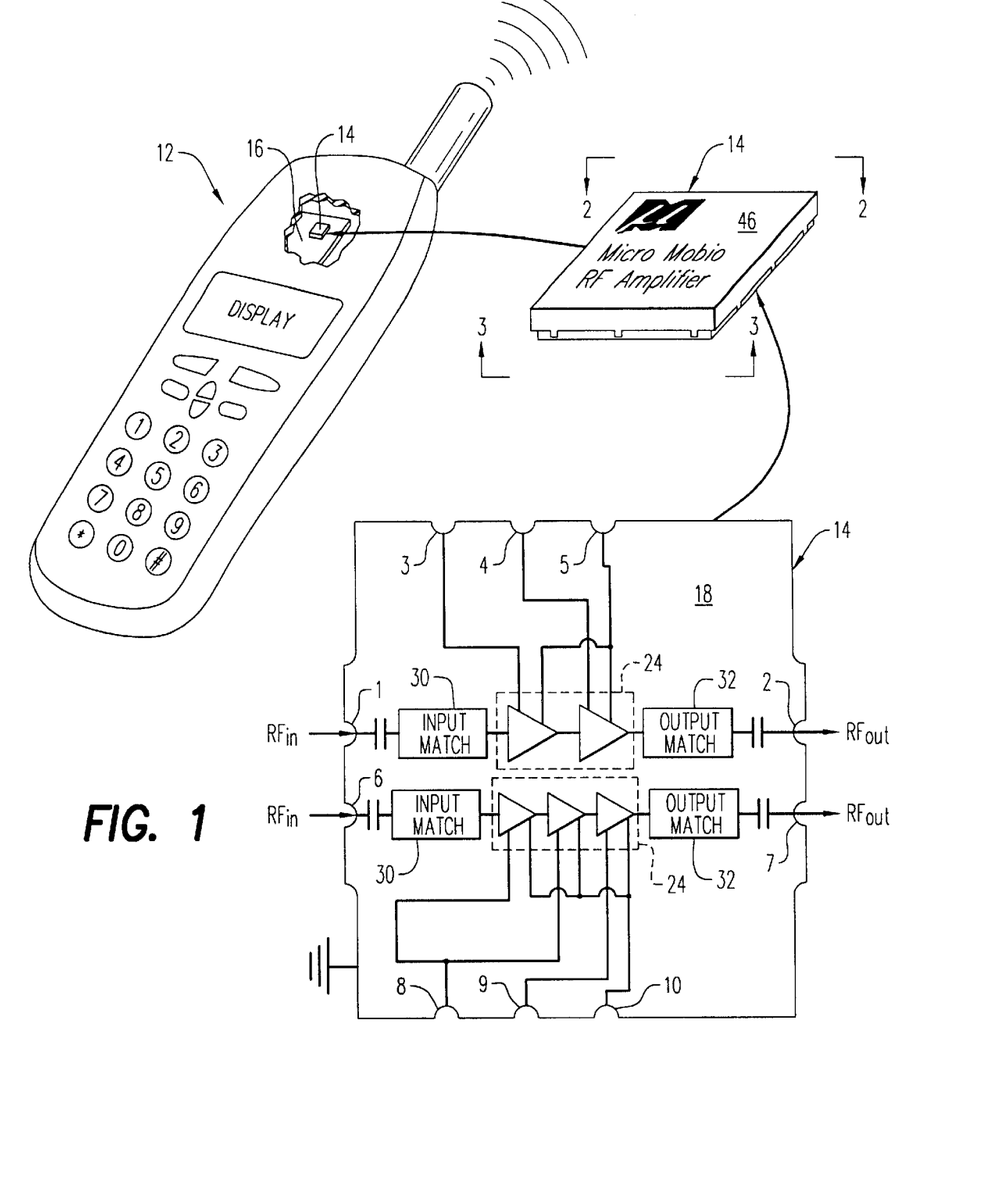
FIG. 1 is a partly schematic representation of an exemplary cellular phone having an RF power amplifier module disposed therein in accordance with an exemplary embodiment of the present invention.

Illustrated in FIG. 1 is an exemplary cellular phone 12 configured for transmitting and receiving radio frequency (RF) signals in an exemplary embodiment of the present invention. The phone includes a miniature RF power amplifier module 14 suitably electrically mounted to a larger printed circuit (PC) main board 16 at a suitable location within the housing of the phone. The module itself has a miniature size of a few millimeters and is shown in enlarged isometric view and in schematic view in flowchart form with the cellphone in which it is integrated.

Figure 2:
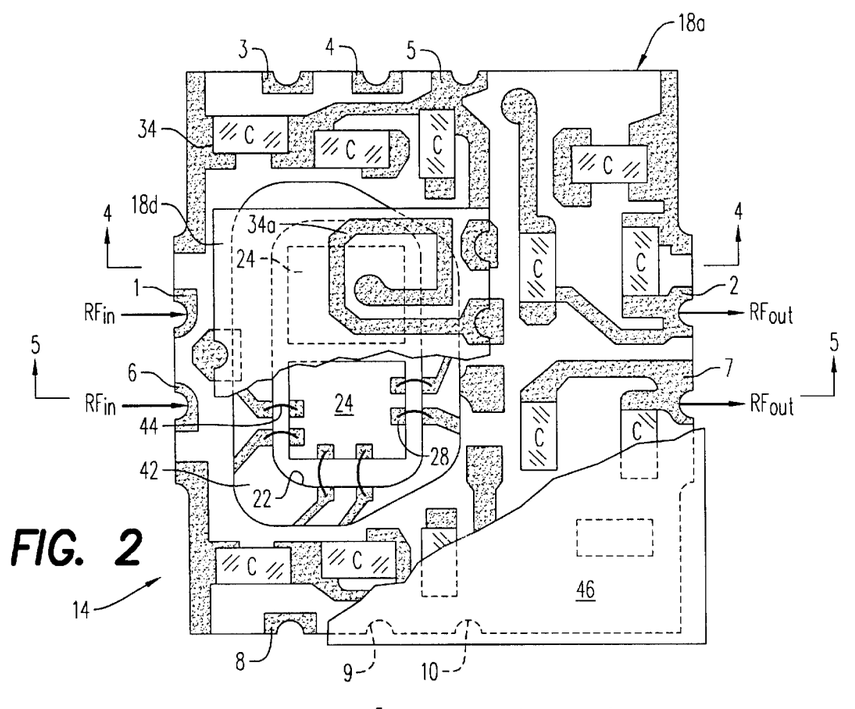
FIG. 2 is a top, plan view of the amplifier module illustrated in FIG. 1, in part section, and taken along line 2—2.
Figure 3:
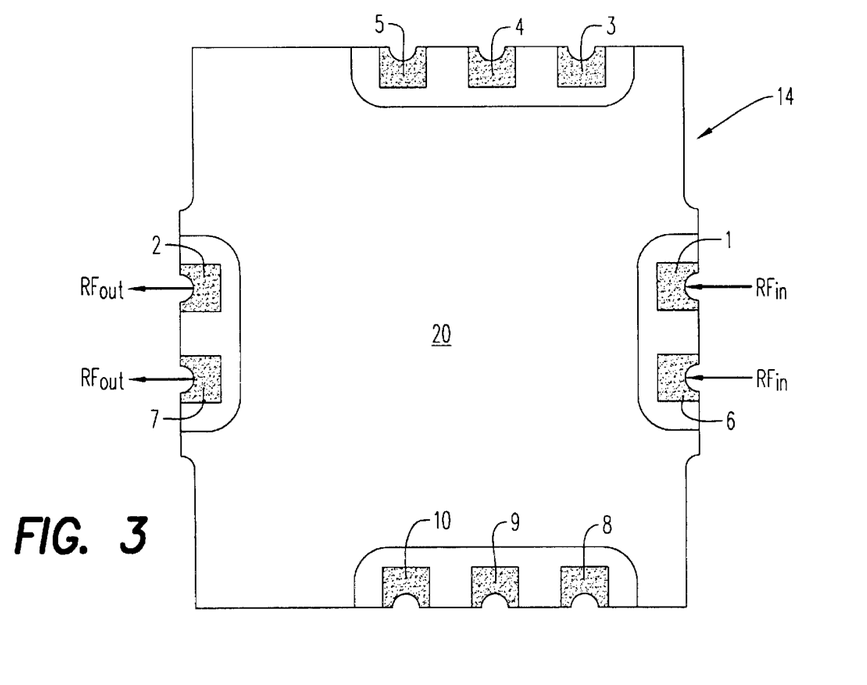
FIG. 3 is a bottom view of the amplifier module illustrated in FIG. 1 and taken along line 3—3.

FIG. 1 illustrates schematically the functional operation of the module, and FIG. 2 illustrates exemplary components thereof. FIG. 3 illustrates the bottom side of the module illustrated in FIG. 2, and FIG. 4 illustrates a representative elevational sectional view through the module.

Figure 4:
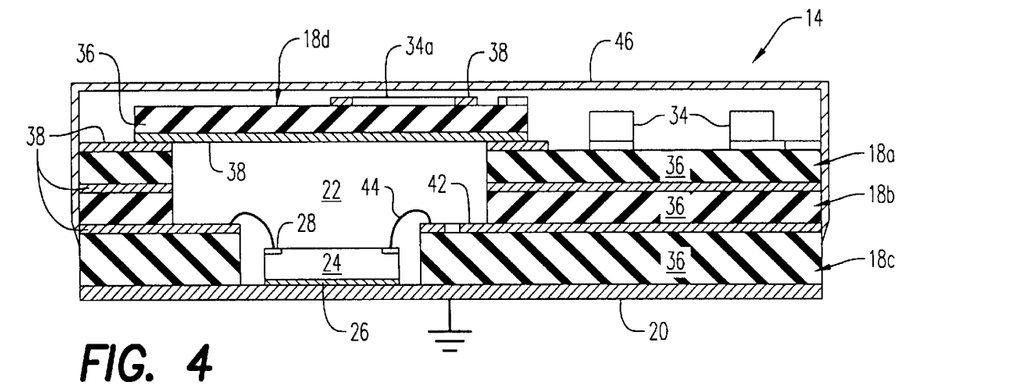
FIG. 4 is an elevational sectional view through the module illustrated in FIG. 2 and taken along line 4—4.

As shown in FIGS. 2 and 4, the module includes a plurality of PC boards identified by the prefix 18 suitably laminated atop a bottom conductor plate 20 formed of a suitable electrical conductor, such as copper for example. The bottom plate is illustrated in more detail in FIG. 3 and preferably matches the rectangular configuration of the multiple PC boards 18 in a vertically stacked configuration.

A cavity or well 22 extends downwardly through the PC boards as illustrated in FIGS. 2 and 4 and includes an RF integrated circuit (IC) semiconductor amplifier chip or die 24.

The chip may have any conventional form for suitably amplifying RF signals in a corresponding frequency band of about 900 MHZ or 1800 MHZ, as desired. In the preferred embodiment, the chip includes Gallium Arsenide Heterojunction Bipolar Transistors (GaAs HBT). However, other semiconductor materials may also be used. As shown in FIG. 4, the chip preferably includes a metalized base 26. The metalized base provides a heat sink over the entire bottom surface of the chip, as well as an electrical ground therefor.

The well 22 extends from the top of the boards to the bottom plate, and the chip 24 is mounted at the bottom of the well directly atop the bottom plate without any dielectric material therebetween. The metalized base 26 is electrically bonded directly atop the plate, by soldering for example.

In this way, the bottom plate 20 provides a relatively large heat sink directly attached to the metalized base of the chip for efficiently dissipating heat therefrom during operation. The bottom plate 20 is preferably substantially larger in surface area than that of the metalized chip base for dissipating the chip heat over a larger surface area. The bottom plate also provides a common electrical ground, for DC, AC, and RF, with the shortest vertical paths or distances between the chip and the bottom plate, as well as between the PC boards and bottom plate.

As shown in FIGS. 2 and 4 the chip 24 also includes top terminals or bonding pads 28 which provide various input and output connections to the internal components of the chip. The top terminals are electrically joined to one or more of the boards in the printed circuits therewith. And, the metalized base 26 provides a corresponding electrical ground for the chip which is directly bonded to the top of the bottom plate 20. Soldering is a preferred bond for providing electrical continuity between the chip base and the bottom plate, and for its high heat transfer capability for dissipating heat into the bottom plate through direct heat conduction.

A particular advantage of the multilayer PC boards illustrated in FIG. 4 is the introduction of three dimensional (3D) printed circuits as opposed to the conventional two dimensional (2D) printed circuits associated with typical PC boards. The amplifier chip 24 is directly bonded to the bottom metal plate 20, and the PC boards 18 rise vertically therearound for providing respective portions of the required printed circuits associated with operating the amplifier chip.

FIG. 1 illustrates schematically the multilayer PC boards 18 which include, in accordance with another feature of the present invention, corresponding input and output RF impedance matching circuits 30,32 that are electrically joined to the terminals of the amplifier chip. The impedance matching circuits 30,32 may have any conventional form, but are integrated in accordance with a preferred embodiment of the present invention with the common module 14 in which the amplifier chip itself is mounted.

The module, including the chip and matching circuits, becomes a unitary or common component which may be conveniently marketed and assembled in any RF transmission device, with correspondingly simplified assembly, compact 3D size, and enhanced RF amplification performance.

As shown in FIG. 4, the boards are a laminated assembly including a topmost or top PC board 18a that provides ingress or access to the well 22 for mounting the chip therein. One or more intermediate PC boards 18b are laminated directly below the top board and atop the bottom plate 20.

Since the top board 18a has an exposed top surface, off-chip electronic components 34 may be joined to the printed circuits exposed atop the top board for use in the input and output impedance matching circuits 30,32 illustrated in FIG. 1.

As indicated above, impedance matching circuits, as well as all circuits associated with operation of the RF amplifier chip 24 are conventional in configuration, but are arranged in a new 3D and compact configuration in accordance with the preferred embodiments of the present invention. The impedance matching circuits include conventional capacitors, resistors, and inductors, in associated transmission lines, cooperating with the RF input and output signals of the amplifier chip. Input impedance matching is conventionally used for optimizing input return loss from the chip, and the output impedance matching circuit is used for optimizing load impedance.

The various off-chip components 34 are mounted to the exposed surface of the top PC board 18a in any suitable configuration as illustrated in FIGS. 2 and 4 for minimizing the overall size of the module. The off-chip components 34 are identified by the reference letter C in FIG. 2 and are interconnected with each other through the printed circuits in the functional arrangement illustrated in FIG. 1 for effecting input and output impedance matching cooperating with RF amplification of the chip 24.

Each of the PC boards 18 illustrated in FIG. 4 may have any conventional form and preferably includes a dielectric substrate or layer 36 and an integral metal layer 38. The laminated boards are each sized in a relatively small area for collectively providing, when stacked or laminated together, all required printed circuits in the several metal layers 38 for operating the chip 24, including the input and output impedance matching circuits therefor.

The fabrication of PC boards is conventional and typically includes electroplating of a conducting metal atop a dielectric substrate, with the desired printed circuits being patterned thereon by photolithographic procedures. Some of the plated metal is then conventionally etched away for creating the electrically conducting printed circuit patterns on the substrate separated from each other by the dielectric of the supporting substrate.

FIG. 2 illustrates in plan view, and FIG. 4 illustrates in section view, portions of the patterned printed circuits interconnecting the various electronic components 34. In the exemplary cross section illustrated in FIG. 4, some of the metal layers 38 include independent grounding portions, which are not part of the main amplification and impedance matching printed circuits, for providing RF grounding and electromagnetic interference (EMI) shielding for the multiple layers of the module.

These grounding and shielding portions are distributed between the printed circuits in any available area therebetween, and are electrically joined to the bottom plate for grounding therewith. Although it is known to use metal for EMI shielding, the exemplary embodiment illustrated in FIG. 4 utilizes available portions of the metal layers 38 in the stacked boards for providing RF grounding and EMI shielding above and to the sides of the chip 24, as well as using the bottom metal plate 20 for RF grounding and EMI shielding for the chip.

Figure 5:
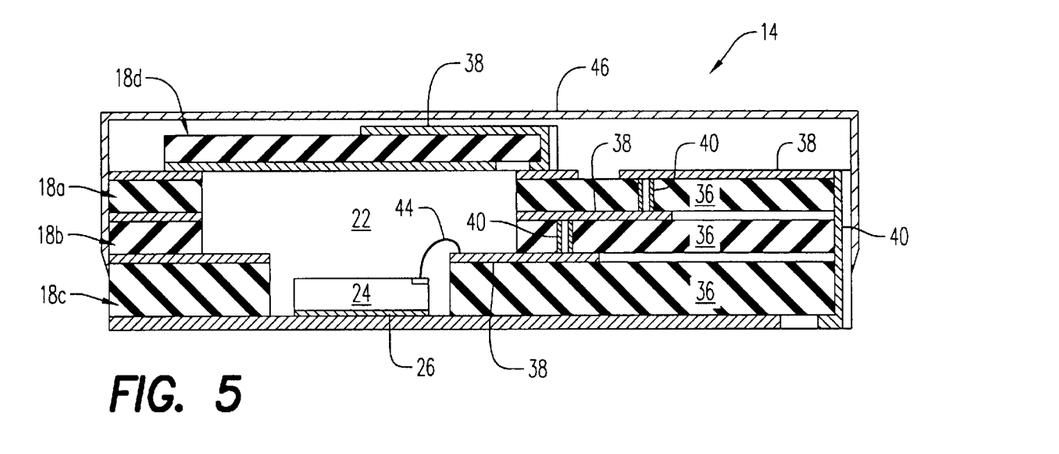
FIG. 5 is an elevational sectional view through the module illustrated in FIG. 2 and taken along line 5—5.

FIG. 5 illustrates another exemplary cross section through the module illustrated in FIG. 2 in which the printed circuits are vertically interconnected between the various metal layers 38 of the multiple PC boards by electrically conductive electrodes or terminals 40 extending vertically or transversely through the various substrates either internally therethrough or at the perimeter thereof as desired. These terminals may be formed by providing vertical holes or side notches in the substrates which are suitably lined with metal during the initial fabrication process.

When the multiple boards are laminated together, the terminals will align with corresponding portions of the metal layers in the desired printed circuits for providing electrical continuity therebetween. The adjoining metal layers of the different boards may be suitably electrically bonded together by solder for example.

In this way, metal layers are provided on both sides of each substrate illustrated in FIGS. 4 and 5 to define respective portions of the printed circuits in 3D layers, as well as providing adjacent metal portions not forming part of the printed circuits. The grounding portions of the metal layers provide effective RF grounding and EMI shielding of the module which cooperates with the shielding provided by the metal bottom plate 20. The grounding portions of the metal layers are preferably electrically joined to the ground bottom plate 20 by dedicated vertical terminals therefor.

As indicated above, the chip metalized base 26 illustrated in FIG. 4 is preferably an integral electrical ground for the integrated circuits of the chip 24 itself. The bottom plate 20 of the module is preferably an electrical ground for the printed circuits defined by the various PC boards and is electrically interconnected to both the printed circuits and the chip base.

In this way, the distance for grounding of the IC chip 24 is minimized in view of the direct soldered joint between the base 26 and the bottom plate 20. And, the vertical terminals 40 minimize the distance of the grounding paths from the multiple layers of the printed circuits to the module grounding plate 20. The difference in electrical potential of the IC ground and the printed circuit ground is therefore minimized for improving performance of the RF amplification.

The PC boards illustrated in FIG. 4 preferably further include a bottom PC board 18c laminated between the intermediate board 18b and the bottom plate 20. The bottom board 18c projects laterally into the well 22 to define a ledge 42 which surrounds the chip 24 as illustrated in more particularity in FIG. 2. The top terminals 28 atop the chip 24 are in the preferred form of bonding pads, and respective portions of the printed circuit defined by the exposed metal layers 38 of the bottom board are also in the preferred form of bonding pads.

The IC chip 24 may therefore be conveniently electrically interconnected to the bottom PC board at the bottom of the well by using respective electrically conducting wires 44 suitably bonded between the chip top terminals 28 and the exposed bonding pads on the ledge 42. A particular advantage of this configuration is that the individual wires 44 may have a suitable length, diameter, and material property for effecting a predetermined electrical inductance for use in the printed circuits. As indicated above, inductance is one value of the input and output impedance matching circuits which may be conveniently introduced by connecting the chip terminals to the adjoining printed circuits using the specifically configured wires 44.

In the preferred embodiment illustrated in FIGS. 4 and 5, the PC boards consist of solely the three boards 18a,b,c collectively defining the well 22 in a suitable portion thereof. Each of the boards then defines a respective portion of the required printed circuits in three dimensions for operating the IC chip 24.

As shown in FIG. 2, the well 22 includes a single IC chip 24 configured for a single band RF operation at about 900 MHZ, for example. The single band chip is the upper chip illustrated in FIG. 2 which corresponds with the upper RF amplification circuit illustrated in FIG. 1.

The perimeter of the bottom plate 20 illustrated in FIG. 3 preferably includes five bonding terminals 1–5 electrically insulated from the metal portion of the bottom plate 20. The terminals 1–5 preferably extend vertically along the sides of the PC boards in corresponding notches therein for joining the printed circuits in the top PC board 18a as illustrated in FIG. 2. Terminal 1 is used for the RF input signal, and terminal 2 is used for the RF output signal. Terminals 3, 4, and 5 are used for power and gain control of the amplifier chip and the voltage supply thereto.

In this way, the RF amplifier module 14 may be configured in one embodiment for single band RF amplification with a minimum of the five input and output terminals 1–5 for inputting and outputting the RF signals through the amplification chip contained therein, with input and output impedance matching for the external circuits contained in the main PC board 16 illustrated in FIG. 1.

The IC chip 24 in typical commercially available form has substantially more than five terminals since associated impedance matching circuits are required therefor. However, those matching circuits are incorporated into the common module 14 for substantially reducing the number of terminals down to five for integration with the main board 16. And, the introduction of the impedance matching circuits in the RF amplifier module 14 permits the further miniaturization thereof and ease of use in the manufacture of an RF transmission device, such as the cell phone illustrated in FIG. 1.

In the exemplary embodiment illustrated in FIGS. 1 and 2, the well 22 is configured for receiving a pair of the RF amplifier chips 24 configured for dual band RF operation. The upper chip 24 illustrated in FIGS. 1 and 2 is configured for one band of operation such as 900 MHZ, and the lower chip 24 illustrated in the figures may be configured for a different band of operation such as 1800 MHZ.

Since the functionality of RF amplification and impedance matching is similar irrespective of the specific frequency band of operation, the two chips are similarly mounted in the common module with corresponding printed circuits and impedance matching in a generally mirror-image symmetry about the horizontal centerline of the module illustrated in FIGS. 1 and 2. One set of five terminals 1–5 is associated with the first chip 24 and its cooperating impedance matching circuits, and a second set of five terminals 6–10 is used for the second chip and its cooperating impedance matching circuits. However, each chip and its cooperating circuits are individually tailored for the specific frequency band, with the first chip having two-stage amplification and the second chip having three-stage amplification, for example.

In the dual band configuration illustrated in FIG. 2, the two chips 24 are mounted in a common well 22 in a symmetrical configuration. The overall vertical width and horizontal length of the rectangular PC boards is about 7 mm by 8 mm which represents a miniature RF amplification module having the substantial benefits described above for use in the exemplary cell phone application illustrated in FIG. 1.

Correspondingly, either half of the module illustrated in FIG. 2 may be eliminated in an alternate embodiment in which a single IC chip 24 is mounted in a correspondingly sized well 22 which surrounds the chip on all sides. In such a configuration, the overall width of the module 14 would be about half that of the dual band module, in particular about 4 mm, with substantially the same 7 mm length.

Preferably, the metal portion of the bottom plate 20 within the local exclusions for the insulated terminals 1–10, underlies substantially all of the bottom PC board 18c as illustrated in FIGS. 3 and 4. In this way, maximum area for the heat sink effected by the metal base plate 20 is provided, as well as maximum area for EMI shielding at the bottom of the module.

Figure 6:
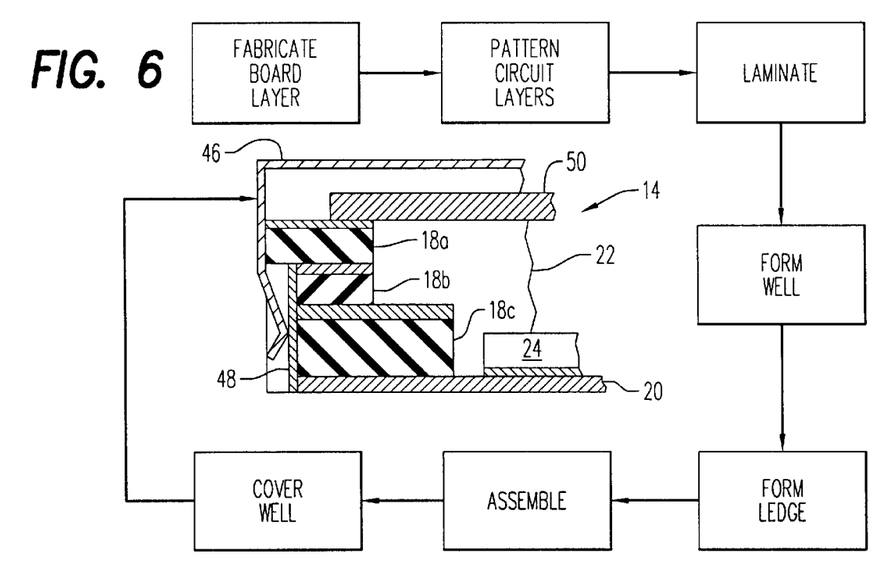
FIG. 6 is an elevational sectional view, like FIG. 4, of a portion of the power module in accordance with another embodiment of the present invention along with a flowchart method of making the module in accordance with an exemplary embodiment.

If desired, additional RF grounding and EMI shielding may be provided by introducing a metal cover or box enclosure 46 as shown in FIGS. 1, 2, and 4 which completely encloses the top board 18a and the well 22 therein. In this way, EMI shielding is effected at the top of the module by the metal cover 46, and at the bottom of the module by the metal base plate 20. As shown in FIG. 6, the metal cover 46 includes side plates which surround the perimeter of the PC boards, which are preferably electrically connected to the bottom plate 20 by metal terminals disposed on the sides of the PC boards.

In the preferred embodiment illustrated in FIG. 6, the laminated PC boards 18 are surrounded around their perimeters by metal sidewalls 48 for providing additional RF grounding and EMI shielding around the perimeter of the module. In this embodiment, the metal cover 46 is electrically joined to the metal sidewalls 48 by abutting contact therewith, or may be soldered thereto if desired.

The metal cover 46, metal sidewalls 48, and metal bottom plate 20 are preferably electrically interconnected, and substantially enclose the laminated boards 18 and RF chip 24 for RF grounding and EMI shielding.

In this way, full perimeter enclosure of the module except for local openings at the bottom plate 20 for the input and output terminals 1–10 may be provided for enhanced RF grounding and EMI shielding of the RF amplifier circuits.

In the preferred embodiment illustrated in FIG. 6, a metal top plate 50 is suitably bonded, by soldering for example, to the top board 18a to hermetically close the well 22 and chip 24 therein. The laminated PC boards and bottom plate hermetically surround the well, with the top plate 50 completing the full hermetic enclosure thereof. In this way, the IC chip 24 is protected from the environment, as well as being fully EMI shielded on all sides.

In this embodiment, the top plate 50 is preferably electrically grounded to the bottom plate 20 through the several layers of the PC boards by using dedicated portions of the printed circuits thereof. And, the separate metal cover 46 may be eliminated if desired.

In the preferred embodiment illustrated in FIGS. 2, 4, and 5, the PC boards further include a cover PC board 18d which is electrically bonded, by soldering for example, to the top board 18a atop the well. Since the well is otherwise open at the top and eliminates respective portions of the surrounding PC boards, the cover board 18d may be used to reintroduce effective surface area for portions of the printed circuits. In this way, respective portions of the printed circuits may be defined by the small cover board 18d which may partly or fully cover the top of the well.

Like the other PC boards, the cover 18d also includes a dielectric substrate 36 and metal layer 38 defining another portion of the printed circuit. And, that portion of the printed circuit defined by the cover board preferably includes at least one additional electronic component, designated 34a, for use in the impedance matching circuits.

In the preferred embodiment illustrated in FIGS. 2 and 4, a top printed circuit metal layer 38 is disposed atop the substrate of the cover board and defines an inductor loop 34a. Correspondingly, the cover board preferably also includes a bottom metal layer 38, as well as the top metal layer, with the bottom layer covering the well and RF chip therein.

This configuration has substantial advantages. For example, the cover board has substantial surface area on which a substantially large inductor loop 34a may be formed, which loop can sustain substantially higher current than standard Surface Mount Technology (SMT) chip inductors. Since inductance is a major contributor to impedance at radio frequencies, the loop inductor 34a may be used to better advantage in impedance matching.

And, the bottom metal layer 38 on the underside of the cover board may be used for RF grounding and EMI shielding of the chip enclosed within the well. The bottom metal layer may be suitably electrically joined through dedicated portions of the printed circuits for grounding to the bottom plate 20.

Figure 7:
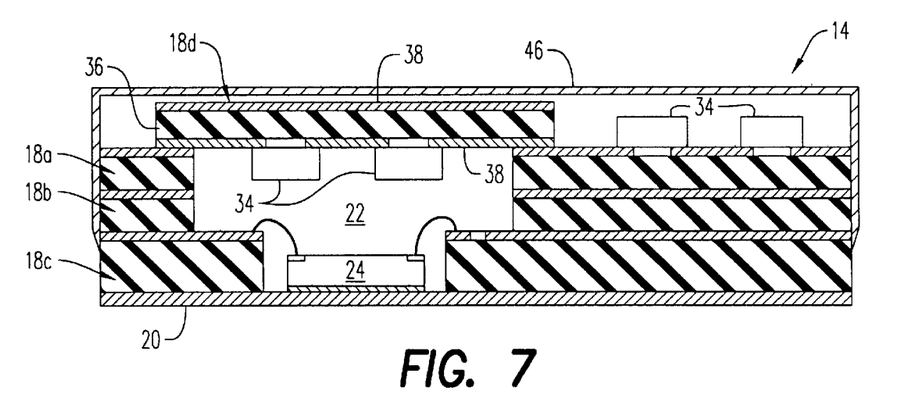
FIG. 7 is an elevational sectional view, like FIG. 4, of the power module in accordance with another embodiment of the present invention.

FIG. 7 illustrates yet another embodiment of the module in which the cover PC board 18d has an inverted configuration to that illustrated in FIG. 4. In this embodiment, the metal layer 38 defining a portion of the printed circuit is a bottom layer disposed below the substrate 36. And, one or more additional electronic components 34 may be disposed inside the well 22 at the top thereof suspended below the bottom metal layer of the cover board. In this way, space inside the top of the well may be used for part of the printed circuits associated with operation of the IC chip for further reducing the overall volume of the module.

In this embodiment, the cover board also includes a top metal layer 38 disposed atop the substrate thereof for providing additional EMI shielding. Preferably the top layer 38 is electrically joined through dedicated portions of the printed circuits to the bottom grounding plate 20.

The integration of the RF amplifier chip 24 in a common module having multiple layers of PC boards creates a 3D configuration in which the printed circuits are distributed over the area of each board laminate as well as in vertical height in the stacked arrangement. A further reduction in size of this module may therefore be effected, with the integration of the input and output matching circuits and the electronic components required therefor.

Since the printed circuits and corresponding electronic components required for operation of the RF amplifier chip 24 have a limited configuration, the various portions of the printed circuits and components may be distributed throughout the multiple layers of PC boards in any suitable manner for minimizing overall volume of the module while enhancing RF performance thereof.

EMI shielding and RF grounding are integrated into the module by the multiple metal layers of the individual PC boards stacked together. The metal bottom plate provides EMI shielding at the bottom of the module and an effective direct heat sink for the amplifier chip mounted to its top side. The well may be enclosed for providing additional EMI shielding and area for introduction of portions of the printed circuits and electronic components therewith. And, the entire module may be surrounded around its sides and top with additional metal for providing full EMI shielding around all sides thereof.

The RF amplifier module described above in various embodiments may be manufactured using conventional manufacturing processes for PC boards and laminations thereof. FIG. 6 illustrates a preferred embodiment.

For example, each of the PC boards 18 is fabricated in a conventional manner with corresponding portions of the required printed circuits thereon as desired for effecting the 3D circuits associated with operation of the IC chip, including the integration of the input and output impedance matching circuits.

The substrates of the PC boards may have any conventional material composition such as fiberglass in an epoxy matrix, or polyimide, or any other suitable material. Suitable metal conducting material is deposited atop the substrates, and photolithographic techniques are used for defining the printed circuit patterns thereon. Metal is selectively removed by etching in a conventional manner to define the resulting printed circuit patterns.

The PC boards may then be suitably adhesively laminated together with the bottom plate 20 into an integral or unitary assembly. When laminated together, the vertical electrodes or terminals providing electrical connection between the several PC boards are aligned and suitably joined together by soldering for example.

The well in the individual PC boards may be preformed in each board, or the well 22 may be machined or drilled through the laminated PC boards to form the surrounding ledge and pocket therebelow in which the IC chip is mounted.

The chip is then soldered to the top of the bottom plate 20 inside the well 22 and electrically connected to the ledge pads. The remaining electrical components 34 are joined to the respective PC boards in an conventional manner. The cover of the well 22 in the various configurations disclosed above is then affixed to the top plate, with the metal cover 46 and sidewalls 48 being assembled for completing the amplifier module.

The amplifier module with its minimum number of exposed terminals may then be conveniently electrically joined to the main PC board of the corresponding RF transmission device such as the cell phone illustrated in FIG. 1.

While there have been described herein what are considered to be preferred and exemplary embodiments of the present invention, other modifications of the invention shall be apparent to those skilled in the art from the teachings herein, and it is, therefore, desired to be secured in the appended claims all such modifications as fall within the true spirit and scope of the invention.

Accordingly, what is desired to be secured by Letters Patent of the United States is the invention as defined and differentiated in the following claims in which we claim:

1. A radio frequency amplifier module comprising:
    a plurality of printed circuit boards laminated atop a bottom electrical conductor plate, and including a radio frequency semiconductor amplifier chip mounted in a well extending through said boards in electrical connection therewith and electrically bonded directly atop said plate;
    said chip includes top terminals electrically joined to one of said boards, and a metalized base directly bonded atop said plate for providing an integral electrical ground for said chip; and
    said bottom plate is an electrical ground for said printed circuit boards electrically interconnecting said boards and said chip base.

2. A module according to claim 1 wherein:
    each of said boards further comprises a dielectric substrate and an integral metal layer;
    said boards are sized in area for collectively providing printed circuits in said metal layers for operating said chip; and
    said metal layers include independent portions not part of said printed circuits for providing radio frequency grounding and electromagnetic interference shielding for said module.

3. A module according to claim 2 wherein said printed circuits include input and output impedance matching circuits electrically joined to said chip.

4. A module according to claim 3 wherein said boards comprise a top board providing access to said well, and an intermediate board laminated between said top board and bottom plate, and said top board includes electronic components for said impedance matching circuits.

5. A module according to claim 4 wherein said independent grounding and shielding portions are distributed between said printed circuits, and are electrically joined to said bottom plate for grounding therewith.

6. A module according to claim 5 wherein said bottom plate matches in configuration said laminated boards for providing a relatively large heat sink directly attached to said metalized base of said chip for dissipating heat therefrom during operation.

7. A module according to claim 5 wherein said printed circuits are interconnected between said metal layers by electrically conductive terminals extending through said substrate therebetween.

8. A module according to claim 7 wherein said independent grounding and shielding portions of said metal layers are electrically joined to said bottom plate by dedicated vertical terminals.

9. A module according to claim 5 wherein said boards further comprise a bottom board projecting into said well to define a ledge surrounding said chip, and said chip top terminals are electrically joined to said printed circuits atop said ledge.

10. A module according to claim 9 wherein said chip top terminals are electrically joined to said ledge by respective wires having length, diameter, and material property for effecting a predetermined inductance in said printed circuits.

11. A module according to claim 9 wherein said boards consist of three boards defining said well, with each of said boards defining a respective portion of said printed circuits.

12. A module according to claim 11 wherein said well includes a single chip configured for single band radio frequency operation, and said bottom plate includes five terminals electrically insulated therefrom and electrically joined to said printed circuits for inputting and outputting a radio frequency signal through said chip with impedance matching to external circuits.

13. A module according to claim 11 wherein said well includes a pair of said chips configured for dual band radio frequency operation, and said bottom plate includes corresponding sets of five terminals electrically insulated therefrom and electrically joined to said printed circuits for inputting and outputting respective dual band radio frequency signals through said chips with impedance matching to external circuits.

14. A module according to claim 11 wherein said chip comprises Gallium Arsenide Heterojunction Bipolar Transistors, and said bottom plate underlies substantially all of said bottom board.

15. A module according to claim 5 further comprising a metal cover enclosing said top board and well for providing shielding for electromagnetic interference.

16. A module according to claim 15 further comprising metal sidewalls surrounding said laminated boards.

17. A module according to claim 16 is wherein said metal cover, metal sidewalls, and metal bottom plate are electrically interconnected, and substantially enclose said laminated boards 18 and radio frequency chip.

18. A module according to claim 5 further comprising a metal top plate bonded to said top board to hermetically close said well and chip therein.

19. A module according to claim 18 wherein said top plate is electrically grounded to said bottom plate through said printed circuits.

20. A module according to claim 5 wherein said boards further comprise a cover electrically bonded to said top board atop said well to define a portion of said printed circuits.

21. A module according to claim 20 wherein said cover board also includes a dielectric substrate and a printed circuit layer, and said printed circuit layer thereof comprises an additional electronic component for said impedance matching circuits.

22. A module according to claim 21 wherein said printed circuit layer of said cover board is disposed atop said substrate thereof.

23. A module according to claim 22 wherein said printed circuit layer of said cover board defines an inductor loop.

24. A module according to claim 23 wherein said cover board further includes a bottom metal layer covering said well and radio frequency chip therein.

25. A module according to claim 21 wherein said printed circuit layer of said cover board is disposed below said substrate thereof.

26. A module according to claim 25 wherein said additional electronic component is disposed inside said well suspended below the bottom metal layer of said cover board.

27. A module according to claim 26 wherein said cover board further includes a top metal layer disposed atop said substrate thereof.

28. A method of making said module according to claim 5 comprising:
fabricating each of said printed circuit boards with corresponding portions of said printed circuits thereon;
laminating together said boards and bottom plate into an integral assembly;
forming said well through said boards; and
assembling said chip and electronic components into said printed circuits.

* * * * *